US012777809B2

(12) United States Patent
Kim et al.

(10) Patent No.: US 12,777,809 B2
(45) Date of Patent: Oct. 27, 2026

(54) DISPLAY APPARATUS

(71) Applicant: Samsung Display Co., Ltd., Yongin-Si (KR)

(72) Inventors: Wooyoung Kim, Yongin-si (KR); Sujeong Kim, Yongin-si (KR); Yunho Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 226 days.

(21) Appl. No.: 18/674,573

(22) Filed: May 24, 2024

(65) Prior Publication Data

US 2025/0081788 A1 Mar. 6, 2025

(30) Foreign Application Priority Data

Aug. 30, 2023 (KR) ........................ 10-2023-0114602

(51) Int. Cl.

*H10K 59/38* (2023.01)
*H10K 59/121* (2023.01)
*H10K 59/35* (2023.01)

(52) U.S. Cl.

CPC ......... *H10K 59/38* (2023.02); *H10K 59/1213* (2023.02); *H10K 59/35* (2023.02)

(58) Field of Classification Search

CPC .... H10K 59/38; H10K 59/1213; H10K 59/35; H10K 59/12; H10K 77/10; H10D 30/6755

See application file for complete search history.

(56) References Cited

U.S. PATENT DOCUMENTS 5,757,452 A * 5/1998 Masaki ............. G02F 1/133512 349/110
7,304,426 B2 12/2007 Hamada
7,564,182 B2 7/2009 Boroson et al.
8,044,577 B2 * 10/2011 Hwang ................ H10K 50/125 313/506
9,153,627 B2 10/2015 Ohsawa et al.

FOREIGN PATENT DOCUMENTS

KR 10-2006-0087982 A 8/2006
KR 10-1924421 B1 12/2018
KR 10-1947073 B1 2/2019

OTHER PUBLICATIONS

Stephen Westland, and Chen J et al., "The CIE System", Jan. 2016, School of Design, University of Leeds, in Handbook of Visual Display Technology, Chen J, Cranton W and Fihn M(eds.), 139-146, Springer-Verlag. 11 pages.

* cited by examiner

*Primary Examiner* — Leonardo Andujar
(74) *Attorney, Agent, or Firm* — Innovation Counsel LLP

(57) ABSTRACT

A display apparatus is disclosed that includes a substrate, a display element layer, and a color filter layer. The display element layer is disposed on the substrate and includes first, second, and third display elements. The first, second, and third display elements each emit light having a same peak spectrum. The color filter layer includes a first, second, and third color filters disposed on the first, second, and third display elements, respectively. The first color filter has a transmission spectrum with a first transmittance in a wavelength range of and including 510 nm to 550 nm and a second transmittance in a wavelength range of and including 630 nm to 660 nm. A ratio of the first transmittance to the second transmittance is in a range of and including 1:0.01 to 1:0.3.

20 Claims, 6 Drawing Sheets

DISPLAY APPARATUS

CROSS-REFERENCE TO RELATED APPLICATION

This application is based on and claims priority under 35 U.S.C. § 119 to Korean Patent Application No. 10-2023-0114602, filed on Aug. 30, 2023, in the Korean Intellectual Property Office, the disclosure of which is incorporated by reference herein in its entirety.

BACKGROUND

1. Field

Embodiments relate to a display apparatus.

2. Description of the Related Art

Various flat displays such as liquid crystal display (LCD), field emission display (FED), and organic light-emitting diode (OLED) have been widely used. In particular, micro displays having a smaller pixel size are used in products such as head mounted displays (HMDs) with a glasses-type monitor for virtual reality (VR) or augmented reality.

Efforts have been made to develop liquid crystal on silicon (LCoS) and organic light-emitting diode on silicon (OLEDoS) to improve optical features such as resolution, luminance, and light emitting efficiency required by micro displays. With regard to OLEDoS, a display technology in which a semiconductor process is used on a wafer substrate, an organic light-emitting diode (OLED) is disposed on a semiconductor wafer substrate on which a complementary metal oxide semiconductor (CMOS) field effect transistor is disposed.

SUMMARY

Embodiments may provide a display apparatus that has excellent color reproduction. However, this feature is illustrative, and the scope of the present disclosure is not limited thereto.

Additional aspects will be set forth in part in the description which follows and, in part, will be apparent from the description, or may be learned by practice of the presented embodiments of the disclosure.

An embodiment of a display apparatus includes a substrate, a display element layer disposed on the substrate and including a first display element, a second display element, and a third display element, the first display element, the second display element, and the third display element each emit light having a same peak spectrum, and a color filter layer disposed on the display element layer and including a first color filter disposed on the first display element, a second color filter disposed on the second display element, and a third color filter disposed on the third display element, The first color filter has a transmission spectrum with a first transmittance in a wavelength range of and including 510 nm to 550 nm and a second transmittance in a wavelength range of and including 630 nm to 660 nm, and a ratio of the first transmittance to the second transmittance is in a range of and including 1:0.01 to 1:0.3.

The ratio of the first transmittance to the second transmittance may be in the range of and including 1:0.01 to 1:0.1.

The first transmittance may be in a range of and including 80% to 99%.

The second transmittance may be about 1% to about 20%.

A first sub-pixel may include the first display element and the first color filter, a second sub-pixel may include the second display element and the second color filter, and a third sub-pixel may include the third display element and the third color filter. In color coordinates based on Commission Internationale de l'Eclairage (CIE) color coordinates, an x coordinate of light emitted by the first sub-pixel may be in a range of and including 0.220 to 0.270, and a y coordinate of the light emitted by the first sub-pixel may be in a range of and including 0.680 to 0.740.

The first display element, the second display element, and the third display element each may emit white light.

Each of the first display element, the second display element, and the third display element may have a peak in a first wavelength range of and including 435 nm to 490 nm, a second wavelength range of and including 500 nm to 590 nm, and a third wavelength range of and including 600 nm to 710 nm.

The substrate may include a semiconductor material.

The display apparatus may further include a pixel circuit layer including at least one transistor between the substrate and the display element layer, and the transistor may be a metal-oxide-semiconductor field effect transistor (MOSFET).

An embodiment of a display apparatus includes a substrate, a display element layer disposed on the substrate and including a first display element, a second display element, and a third display element, the first display element, the second display element, and the third display element each emit light having a same peak spectrum, and a color filter layer disposed on the display element layer and including a first color filter disposed on the first display element, a second color filter disposed on the second display element, and a third color filter disposed on the third display element. The first color filter may have a transmission spectrum with a first transmittance in a wavelength range of and including 510 nm to 550 nm and a second transmittance in a wavelength range of and including 630 nm to 660 nm, and the first transmittance may be in a range of and including 80% to 99%.

The ratio of the first transmittance to the second transmittance may be in a range of and including 1:0.01 to 1:0.1.

The second transmittance may be in a range of and including 1% to 20%.

A first sub-pixel may include the first display element and the first color filter, a second sub-pixel may include the second display element and the second color filter, and a third sub-pixel may include the third display element and the third color filter. In color coordinates based on Commission Internationale de l'Eclairage (CIE) color coordinates, an x coordinate of light emitted by the first sub-pixel may be in a range of and including 0.220 to 0.270, and a y coordinate of the light emitted by the first sub-pixel may be in a range of and including 0.680 to 0.740.

Each of the first display element, the second display element, and the third display element may have a peak in a first wavelength range of and including 435 nm to 490 nm, a second wavelength range of and including 500 nm to 590 nm, and a third wavelength range of and including 600 nm to 710 nm.

The substrate may include a semiconductor material.

The display apparatus may further include a pixel circuit layer including at least one transistor between the substrate and the display element layer, and the transistor may be a metal-oxide-semiconductor field effect transistor (MOSFET).

An embodiment a display apparatus includes a substrate, a display element layer disposed on the substrate and including a first display element, a second display element, and a third display element, the first display element, the second display element, and the third display element each emit light having a same peak spectrum, and a color filter layer disposed on the display element layer and including a first color filter disposed on the first display element, a second color filter disposed on the second display element, and a third color filter disposed on the third display element. The first color filter may have a transmission spectrum with a first transmittance in a wavelength range of and including 510 nm to 550 nm and a second transmittance in a wavelength range of 630 nm to 660 nm. A first sub-pixel may include the first display element and the first color filter, a second sub-pixel may include the second display element and the second color filter, and a third sub-pixel may include the third display element and the third color filter. In color coordinates based on Commission Internationale de l'Eclairage (CIE) color coordinates, an x coordinate of light emitted by the first sub-pixel may be in a range of and including 0.220 to 0.270, and a y coordinate of the light emitted by the first sub-pixel may be in a range of and including 0.680 to 0.740.

Each of the first display element, the second display element, and the third display element each may emit white light.

Each of the first display element, the second display element, and the third display element may have a peak in a first wavelength range of and including 435 nm to 490 nm, a second wavelength range of and including 500 nm to 590 nm, and a third wavelength range of and including 600 nm to 710 nm.

The ratio of the first transmittance to the second transmittance may be in the range of and including 1:0.01 to 1:0.1.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
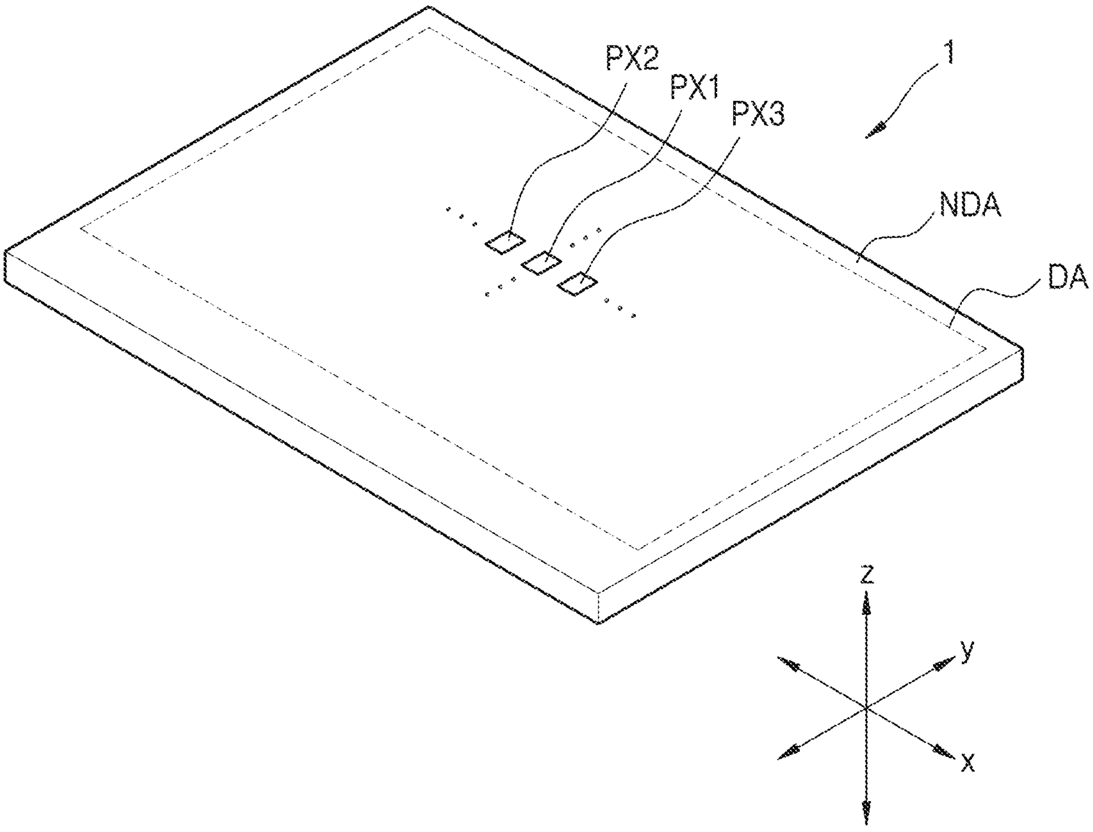
FIG. 1 is a perspective view schematically illustrating a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B." Throughout the disclosure, the expression "at least one of a, b or c" indicates only a, only b, only c, both a and b, both a and c, both b and c, all of a, b, and c, or variations thereof.

Since various modifications and various embodiments of the present disclosure are possible, specific embodiments are illustrated in the drawings and described in detail in the detailed description. Effects and features of the present disclosure, and a method of achieving them will be apparent with reference to embodiments described below in detail in conjunction with the drawings. However, the present disclosure is not limited to the embodiments disclosed herein, but may be implemented in a variety of forms.

In the following embodiments, the terms of the first and second, etc. were used for the purpose of distinguishing one element from other element s, not a limited sense.

In the following embodiments, the singular expression includes a plurality of expressions unless the context is clearly different.

In the following embodiments, the terms such as comprising or having are meant to be the features described in the specification, or the element s are present, and the possibility of one or more other features or elements will be added, is not excluded in advance.

In the following embodiments, when a portion such as a layer, a region, an element or the like is on other portions, this is not only when the portion is on other elements, but also when other elements are interposed therebetween.

In the drawings, for convenience of explanation, the sizes of elements may be exaggerated or reduced. For example, since the size and thickness of each element shown in the drawings are arbitrarily indicated for convenience of explanation, the present disclosure is not necessarily limited to the illustration.

In the following embodiments, the case where a wiring "extends in a first direction or a second direction" refers to not only extending in a straight line shape, but also extending in a zigzag or curved shape along the first direction or the second direction.

In the following embodiments, when referred to as a "planar," it means when a target portion is viewed from above, and when referred to as a "cross-sectional view," it means when a cross section of the target portion cut vertically is viewed from a side. In the following embodiments, "overlap" includes "planar" and "cross-sectional" overlap.

Hereinafter, embodiments of the present disclosure will be described in detail with reference to the accompanying drawings, and the same or corresponding components are denoted by the same reference numerals.

FIG. 1 is a perspective view schematically illustrating a display apparatus 1 according to an embodiment.

Referring to FIG. 1, the display apparatus 1 may include a display area DA in which an image is generated, and a non-display area NDA in which no image is generated. The display apparatus 1 may provide an image through an array of a plurality of sub-pixels that are two-dimensionally arranged in an x-y plane in the display area DA. The plurality of sub-pixels may emit lights of different colors, and may include, for example, a green sub-pixel, a red sub-pixel, and a blue sub-pixel.

In an embodiment, the plurality of sub-pixels may include a first sub-pixel PX1, a second sub-pixel PX2, and a third sub-pixel PX3. Hereinafter, for convenience of explanation, the case where the first sub-pixel PX1 is a green sub-pixel, the second sub-pixel PX2 is a red sub-pixel, and the third sub-pixel PX3 is a blue sub-pixel will be described.

Each of the first sub-pixel PX1, the second sub-pixel PX2, and the third sub-pixel PX3 is an area in which green light, red light and blue light may be emitted, and the display apparatus 1 may provide an image by using lights emitted from the sub-pixels.

The non-display area NDA may be an area in which no image is provided and may surround the display area DA. In the non-display area NDA, a driver or main voltage line for providing electrical signals or power to pixel circuits may be arranged. A pad, that is, an area in which an electronic device or a printed circuit board may be electrically connected, may be included in the non-display area NDA.

The display area DA may have a polygonal shape such as a rectangle as shown in FIG. 1. For example, the display area DA may have a rectangular shape in which a horizontal length is greater than a vertical length, a rectangular shape in which the horizontal length is less than the vertical length, or a square shape. In another embodiment, the display area DA may have a polygonal shape such as a circular shape, an oval shape, a triangular shape, or a pentagonal shape. Also, the display apparatus 1 of FIG. 1 shows a flat display apparatus having a flat shape, but the display apparatus 1 may be implemented in various shapes such as flexible, foldable, rollable display apparatuses.

The display apparatus 1 may be applied to various products, such as mobile phones, smart phones, table personal computers (PCs), mobile communication terminals, electronic notes, electronic books, portable multimedia players (PMPs), navigation devices, ultra mobile PCs, televisions (TVs), laptop computers, monitors, billboards, Internet of Things (IOT), and the like. In addition, the display apparatus 1 according to an embodiment may be used for a wearable device such as a smart watch, a watch phone, a glasses type display, or a head mounted display (HMD). In addition, the display apparatus 1 according to an embodiment may be used as an instrument panel of a vehicle, and a center information display (CID) display disposed on a center fascia or a dashboard of a vehicle, a room mirror display for replacing a side mirror of a vehicle, and a display screen that is entertainment for the rear seat of the vehicle and is disposed on the rear surface of the front seat.

Also, hereinafter, the display apparatus 1 includes an organic light-emitting diode (OLED) as a display element. However, the display apparatus 1 according to one or more embodiments is not limited thereto. In another embodiment, the display apparatus 1 may be a light-emitting display apparatus including an inorganic light-emitting diode, i.e., an inorganic light-emitting display apparatus. In another embodiment, the display apparatus 1 may be a quantum dot light-emitting display apparatus.

Figure 2:
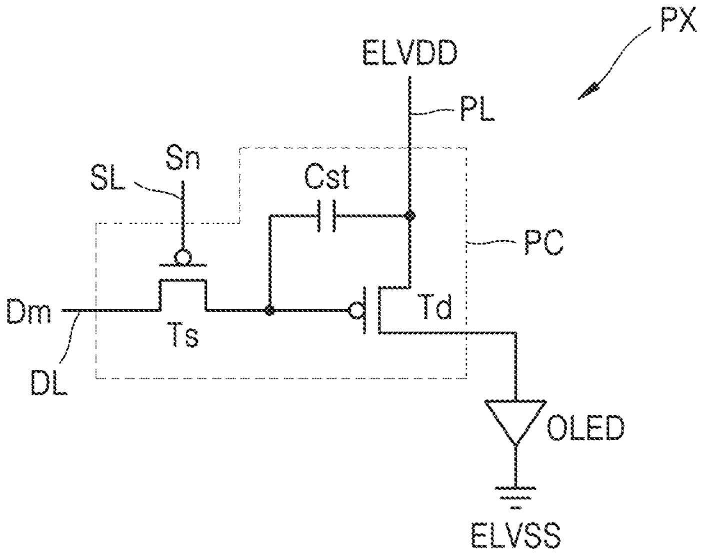
FIG. 2 is an equivalent circuit diagram of a sub-pixel circuit PC of a display apparatus according to an embodiment.

FIG. 2 is an equivalent circuit diagram of one sub-pixel circuit PC of a display apparatus according to an embodiment. The sub-pixel circuit PC may be electrically connected to the display element, and one display element may correspond to one sub-pixel PX. For example, the display element may be an organic light-emitting diode OLED.

The sub-pixel circuit PC may include a first transistor Td, a second transistor Ts, and a storage capacitor Cst. The second transistor Ts may be a switching transistor, may be connected to a scan line SL and a data line DL, and may be turned on by a switching signal input from the scan line SL and may be configured to transmit a data signal input from the data line DL to the first transistor Td. The storage capacitor Cst may have one end electrically connected to the second transistor Ts and the other end electrically connected to a driving voltage line PL, and may store a voltage that corresponds to a difference between a voltage transmitted from the second transistor Ts and the driving power supply voltage ELVDD supplied to the driving voltage line PL.

The first transistor Td may be a driving transistor, may be connected to the driving voltage line PL and the storage capacitor Cst, and may control the magnitude of a driving current flowing through the organic light-emitting diode OLED from the driving voltage line PL in response to a voltage value stored in the storage capacitor Cst. The organic light-emitting diode OLED may emit light having a certain luminance by using the driving current. An opposite electrode (see 230 of FIG. 3) of the organic light-emitting diode OLED may receive an electrode power supply voltage ELVSS.

FIG. 2 illustrates the case where the sub-pixel circuit PC includes two transistors and one storage capacitor, and embodiments are not limited thereto. For example, the number of transistors or the number of storage capacitors may be variously changed according to the design of the sub-pixel circuit PC.

Figure 3:
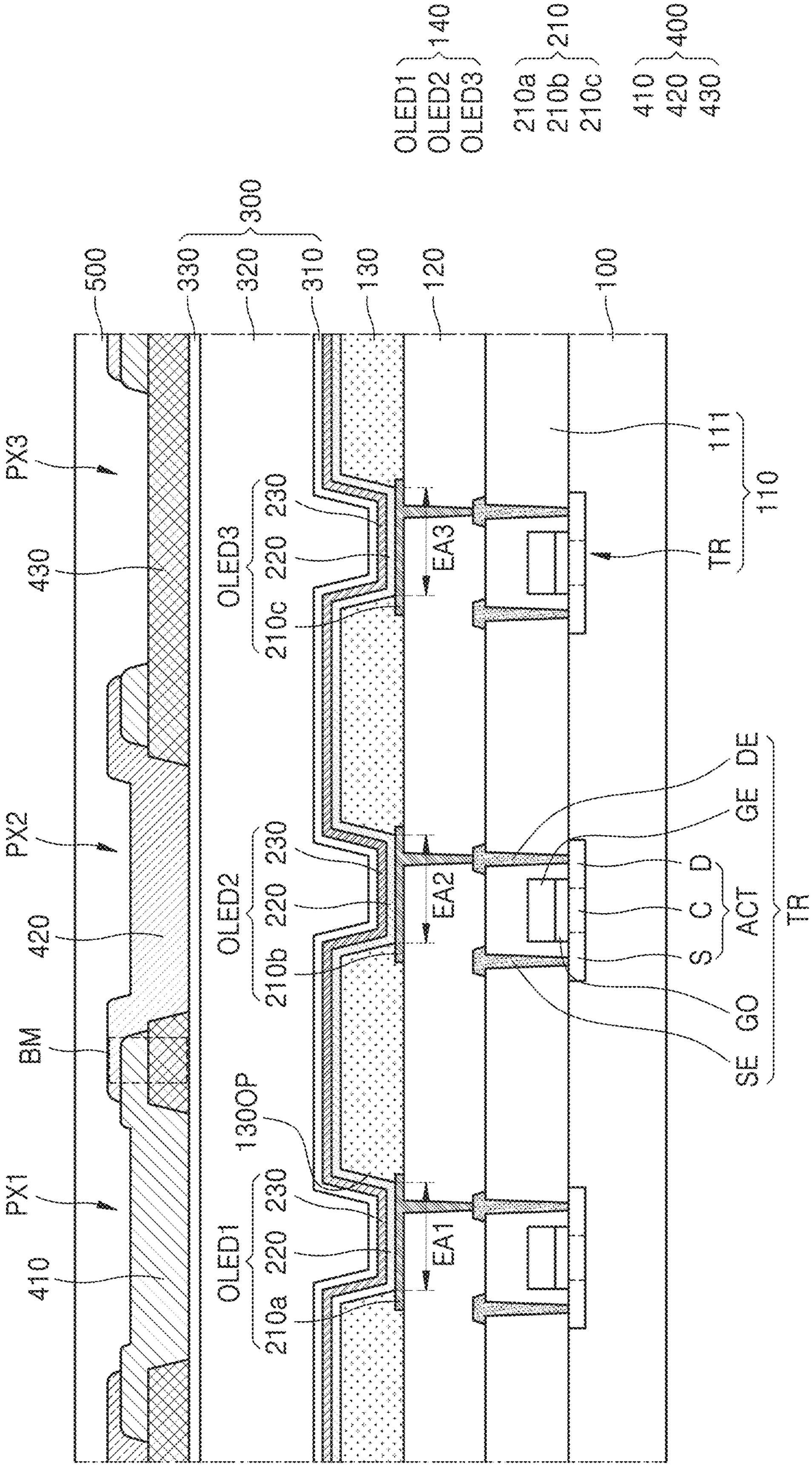
FIG. 3 is a cross-sectional view schematically illustrating a display apparatus according to an embodiment.

FIG. 3 is a cross-sectional view schematically illustrating a display apparatus 1 according to an embodiment.

Referring to FIG. 3, the display apparatus 1 may include a substrate 100, a pixel circuit layer 110 including a transistor TR, a via insulating layer 120 on the pixel circuit layer 110, a display element layer 140 on the via insulating layer 120, an encapsulation layer 300 on the display element layer 140, and a color filter layer 400 on the encapsulation layer 300.

The substrate 100 may have an upper surface that extends in an x direction and a y direction. The substrate 100 may include a semiconductor material, for example, an IV-group semiconductor, an III-V-group compound semiconductor, or an II-VI-group compound semiconductor. That is, the substrate 100 may be a semiconductor substrate including a semiconductor material. Specifically, the substrate 100 may include silicon (Si). That is, the substrate 100 may include a silicon substrate (a silicon semiconductor substrate). For example, the substrate 100 may be a silicon wafer. The silicon wafer may include a monocrystalline silicon wafer, a polycrystalline silicon wafer, or an amorphous silicon wafer.

Like this, an organic light-emitting diode display apparatus in which a semiconductor substrate is used as the substrate 100, may be referred to as an OLED on Silicon (OLEDoS). Since an OLEDoS uses a semiconductor substrate as the substrate 100, a transistor manufacturing process that is commonly used in a semiconductor technology field may be used as a manufacturing process of a display apparatus. Thus, the formation of an ultra-small pixel and the control of such a pixel is possible, so that the OLEDOS may display an image having ultra-high resolution.

As occasions demand, the type of the substrate 100 may not be limited to the semiconductor substrate. For example, the substrate 100 may include glass, metal or polymer resin. In addition, the substrate 100 may include a polymer resin, such as polyethersulfone, polyacrylate, polyether imide, polyethylene naphthalate, polyethylene terephthalate, polyphenylene sulfide, polyarylate, polyimide, polycarbonate, or cellulose acetate propionate. Of course, various modifications are possible, such as the substrate 100 may have a multi-layered structure including two layers including such a polymeric resin and a barrier layer between the layers, wherein the barrier layer includes an inorganic material (e.g., silicon oxide, silicon nitride, silicon oxynitride, etc.) between the layers. Hereinafter, the case where the substrate 100 is a silicon substrate, will be described in detail.

A pixel circuit layer 210 may be disposed on the substrate 100. The pixel circuit layer 110 may include a plurality of sub-pixel circuits corresponding to first through third sub-pixels PX1, PX2, and PX3, respectively, to be described above with reference to FIG. 1, and each of the plurality of sub-pixel circuits may include a transistor and a capacitor, as described above with reference to FIG. 2. The pixel circuit layer 110 may include at least one transistor TR and at least one insulating layer.

FIG. 3 illustrates that an organic light-emitting diode OLED as a display element is located on the substrate 100. The organic light-emitting diode OLED being electrically connected to the sub-pixel circuit PC may be understood that the pixel electrode 210 of the organic light-emitting diode OLED is electrically connected to a transistor TR of the sub-pixel circuit (see PC of FIG. 2). For convenience of illustration, FIG. 3 illustrates the transistor TR being connected to each of the first through third organic light-emitting diodes OLED1, OLED2, and OLED3. Thus, the transistor TR may correspond to the above-described first transistor (see Td of FIG. 2).

The transistor TR may include a gate dielectric layer GO, a gate electrode GE, and an active region ACT. The transistor TR may be a metal-oxide-semiconductor field effect transistor (MOSFET), for example, and embodiments are not limited thereto. In an embodiment, the transistors TR may be isolated from each other by a device isolation region between the transistors TR.

The active region ACT may be within the substrate 100. The active region ACT may be as part of the substrate 100. The active region ACT may extend in a first direction, for example, an x direction within the substrate 100. Part of the substrate 100 may be recessed, and the active region ACT may be on the recessed substrate 100. The active region ACT may include a channel region C, and a drain region D and a source region S, which are at both sides of the channel region C. Each of the drain region D and the source region S may be a region doped with impurities on the substrate 100 including a semiconductor material. The channel region C may overlap the gate electrode GE.

The gate dielectric layer GO may be between the gate electrode GE and the active region ACT. The gate insulating layer GO may include an inorganic insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The gate electrode GE may be disposed on the active region ACT. The gate electrode GE may cross the active region ACT and may extend in one direction, for example, a y direction. The channel region C of the transistor TR may be formed in the active region ACT crossing the gate electrode GE. That is, the gate electrode GE may overlap the channel region C of the transistor TR. The gate electrode GE may be disposed on the gate dielectric layer GO. The gate electrode GE may include a conductive material. For example, the gate electrode GE may include a metal nitride such as titanium nitride (TiN), tantalum nitride (TAN), or tungsten nitride (WN), or a metal material such as aluminum (Al), tungsten (W), copper (Cu) or molybdenum (Mo), or a semiconductor material such as doped polysilicon. The gate electrode GE may have a multi-layered or single layer structure including the above-described materials.

The interlayer insulating layer 111 may be disposed on the substrate 100 and may cover the transistor TR. The interlayer insulating layer 111 may include at least one of oxide, nitride, and oxynitride. The interlayer insulating layer 111 may have a single layer or multi-layered structure.

The drain electrode DE and the source electrode SE may be located on the interlayer insulating layer 111. The drain electrode DE and the source electrode SE may be connected to the drain region D and the source region S of the active region ACT, respectively, through a contact hole in the interlayer insulating layer 111. The drain electrode DE and the source electrode SE may include a good conductive material. The drain electrode DE and the source electrode SE may include a conductive material including Mo, Al, Cu, Ti, or the like, and may have a multi-layered or single layer structure including the materials described above.

The via insulating layer 120 may be disposed on the pixel circuit layer 110. The via insulating layer 120 may cover upper surfaces of the drain electrode DE and the source electrode SE and have a generally flat upper surface and thus may be an organic insulating layer that functions as a planarization layer. The via insulating layer 120 may include an organic material such as acryl, benzocyclobutene (BCB) or hexamethyldisiloxane (HMDSO). The via insulating layer 120 is shown as having a single layer structure, but embodiments are not limited thereto, and the via insulating layer 120 may have a multi-layered structure.

The display element layer 140 may be disposed on the via insulating layer 120. The display element layer 140 may include a first organic light-emitting diode OLED1, a second organic light-emitting diode OLED2, and a third organic light-emitting diode OLED3.

The first through third organic light-emitting diodes OLED1, OLED2, and OLED3 may have a stack structure of the pixel electrode 210, the light-emitting layer 220 and the opposite electrode 230. The first, second, and third organic light-emitting diodes OLED1, OLED2, and OLED3 may be referred to as first, second, and third display elements, respectively. Each of the first through third organic light-emitting diodes OLED1, OLED2, and OLED3 may emit light having the same peak spectrum. For example, each of the first through third organic light-emitting diodes OLED1, OLED2, and OLED3 may emit white light. For example, the peak spectrum of each of the first through third organic light-emitting diodes OLED1, OLED2, and OLED3 may have a peak in a first wavelength range of 435 nm to 490 nm, a second wavelength range of 500 nm to 590 nm, and a third wavelength range of 600 nm to 710 nm. The first through third organic light-emitting diodes OLED1, OLED2, and OLED3 may emit light, and areas in which light is emitted, may be defined as first through third emission areas EA1, EA2, and EA3.

A plurality of pixel electrodes 210 may be arranged on the via insulating layer 120. The plurality of pixel electrodes 210 may be electrically connected to the transistor TR via a contact hole provided in the via insulating layer 120. Each of the pixel electrodes 150 may include a transparent conductive layer formed of transparent conductive oxide such as ITO, $In_2O_3$, or IZO, and a reflective layer formed of metal such as Al or Ag. For example, each of the pixel electrodes 210 may have a three-layer structure of ITO/Ag/ITO.

As shown in FIG. 3, the pixel electrodes 210 may include a first pixel electrode 210*a*, a second pixel electrode 210*b*, and a third pixel electrode 210*c*. The first through third pixel electrodes 210*a*, 210*b*, and 210*c* may be spaced apart from each other when viewing in a direction perpendicular to the substrate 100.

The light-emitting layer 220 may be disposed on the pixel electrodes 210. The light-emitting layer 220 may be disposed to cover the pixel electrodes 210 on the via insulating layer 120. In an embodiment, the light-emitting layer 220 may be integrally formed over the plurality of pixel electrodes 210. In another embodiment, the light-emitting layer 220 may be patterned to correspond to each of the plurality of pixel electrodes 210.

The light-emitting layer 220 may emit light of a certain color. For example, the light-emitting layer 220 may emit white light. The light-emitting layer 220 may have an emission spectrum as described above with reference to FIG. 4. For example, the light-emitting layer 220 may have an emission spectrum having a peak in a first wavelength range of 435 nm to 490 nm, a second wavelength range of 500 nm to 590 nm, and a third wavelength range of 600 nm to 710 nm.

In an embodiment, the light-emitting layer 220 may include a polymer or low-molecular weight organic material. The light-emitting layer 220 may include an organic light-emitting layer. For example, the light-emitting layer 220 may include a polymer material based on polyphenylene vinylene (PPV), polyfluorene, or the like. The light-emitting layer 220 may be formed using screen printing or inkjet printing, laser induced thermal imaging (LITI), or the like. However, embodiments are not limited thereto, and the light-emitting layer 220 may include an inorganic light-emitting material or quantum dots.

In an embodiment, a functional layer (not shown) may be disposed under and on the light-emitting layer 220. The functional layer may include a Hole Injection Layer (HIL), a Hole Transport Layer (HTL), an Electron Transport Layer (ETL) or an Electron Injection Layer (EIL). The functional layer may be integrally formed over the plurality of pixel electrodes 210, or may be patterned to correspond to each of the plurality of pixel electrodes 210.

An opposite electrode 230 may be disposed on the pixel electrodes 210 and may overlap the pixel electrodes 210. The opposite electrode 230 may be disposed on the light-emitting layer 220. The opposite electrode 230 may include a conductive material having a low work function. For example, the opposite electrode 230 may include a (semi-) transparent layer including silver (Ag), magnesium (Mg), Al, platinum (Pt), palladium (Pd), gold (Au), nickel (Ni), neodymium (Nd), iridium (Ir), chromium (Cr), lithium (Li), calcium (Ca) or an alloy thereof. Alternatively, the opposite electrode 230 may further include a layer such as ITO, IZO, ZnO or $In_2O_3$ on the (semi-) transparent layer including the above-described materials. The opposite electrode 230 may be integrally formed to cover the substrate 100 entirely.

A pixel-defining layer 130 may be disposed on the via insulating layer 120. The pixel-defining layer 130 may include an opening 130OP corresponding to the first through third sub-pixels PX1, PX2, and PX3. The opening 130OP of the pixel-defining layer 130 may expose at least part of each of the pixel electrodes 210, for example, a central part thereof. In an embodiment, the first through third emission areas EA1, EA2, and EA3 may be defined as areas exposed by the opening 130OP of the pixel-defining layer 130. The pixel-defining layer 130 may include an organic insulating material and an inorganic insulating material. The pixel-defining layer 130 may include an organic material such as polyimide or HMDSO. The pixel-defining layer 130 may be omitted according to embodiments.

A spacer (not shown) may be further disposed on the pixel-defining layer 130 to prevent from damaging by mask. In an embodiment, the spacer may be integrally formed with the pixel-defining layer 130. For example, the spacer and the pixel-defining layer 130 may be simultaneously formed in the same process by using a halftone mask process.

The encapsulation layer 300 may be disposed on the opposite electrode 230. The encapsulation layer 300 may be disposed to cover the plurality of organic light-emitting diodes OLED1, OLED2, and OLED3. The encapsulation layer 300 may include at least one inorganic encapsulation layer and at least one organic encapsulation layer. In an embodiment, the encapsulation layer 300 may include a first inorganic encapsulation layer 310, an organic encapsulation layer 320 on the first inorganic encapsulation layer 320, and a second inorganic encapsulation layer 330.

The first inorganic encapsulation layer 310 and the second inorganic encapsulation layer 330 may include one or more inorganic materials among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, polyethylene, or the like. In an embodiment, the organic encapsulation layer 320 may include acrylate. The organic encapsulation layer 320 may be formed by hardening monomer or by coating polymer. The organic encapsulation layer 320 may have transparency.

The color filter layer 400 may be disposed on the encapsulation layer 300. The color filter layer 400 may include a first color filter 410, a second color filter 420, and a third color filter 430 through which lights of different colors transmit. The first through third color filters 410, 420, and 430 may be disposed to correspond to the first through third sub-pixels PX1, PX2, and PX3. The first, second, and third sub-pixels PX1, PX2, and PX3 may be referred to as including the first, second, and third display elements and the first, second, and third color filters 410, 420, and 430, respectively. The first through third color filters 410, 420, and 430 may be disposed to correspond to pixel electrodes 210 of the first through third organic light-emitting diodes OLED1, OLED2, and OLED3. For example, the first color filter 410 may be disposed to overlap the first pixel electrode 210*a* of the first organic light-emitting diode OLED1 in a direction (i.e., a z direction) perpendicular to the substrate 100. For example, the second color filter 420 may be disposed to overlap the second pixel electrode 210*b* of the second organic light-emitting diode OLED2 in the direction (i.e., the z direction) perpendicular to the substrate 100. For example, the third color filter 430 may be disposed to overlap the third pixel electrode 210*c* of the third organic light-emitting diode OLED3 in the direction (i.e., the z direction) perpendicular to the substrate 100.

The first through third color filters 410, 420, and 430 may include photosensitive resin. The first through third color filters 410, 420, and 430 may include pigments or dyes that indicate inherent colors, respectively.

Green, red or blue light may transmit through each of the first through third color filters 410, 420, and 430.

For example, the first color filter 410 may be a green color filter through which green light of light emitted from the light-emitting layer 220 transmits. The first color filter 410 may have a transmission spectrum with a first transmittance in the wavelength range of about 510 nm to about 550 nm and a second transmittance in the wavelength range of about 630 nm to about 660 nm. In this case, the second transmittance of the first color filter 410 may be smaller than the first transmittance. The second transmittance of the first color filter 410 in the wavelength range of about 630 nm to about 660 nm may be greater than 0. The first transmittance may be a transmittance in a first peak wavelength of the light-emitting layer 220, and the second transmittance may be a transmittance in a second peak wavelength of the light-emitting layer 220. The first peak wavelength of the light-emitting layer 220 may be a wavelength in the wavelength range of about 510 nm to about 550 nm. The second peak wavelength of the light-emitting layer 220 may be a wavelength in the wavelength range of about 630 nm to about 660 nm.

For example, the ratio of the first transmittance to the second transmittance of the first color filter 410 may be 1:0.01 to 1:0.3. In other words, the ratio of the first transmittance in the first peak wavelength of the light-emitting layer 220 of the first color filter 410 to the second transmittance in the second peak wavelength of the light-emitting layer 220 of the first color filter 410 may be 1:0.01 to 1:0.3. For example, the ratio of the first transmittance to the second transmittance of the first color filter 410 may be 1:0.01 to 1:0.1. For example, the ratio of the first transmittance to the second transmittance of the first color filter 410 may be 1:0.01 to 1:0.07. For example, the first transmittance of the first color filter 410 may be about 80% to about 99%. For example, the first transmittance of the first color filter 410 may be about 80% to about 95%. When the first transmittance is 80% or less, color purity may be lowered. For example, the second transmittance of the first color filter 410 may be about 1% to about 20%. For example, the second transmittance of the first color filter 410 may be about 1% to about 10%. For example, the second transmittance of the first color filter 410 may be about 1% to about 8%. For example, the second transmittance of the first color filter 410 may be about 2% to about 6%. When the first transmittance and the second transmittance of the first color filter 410 satisfy the above range, the display apparatus 1 may implement high resolution of about 4000 ppi. When the first transmittance and the second transmittance of the first color filter 410 satisfy the above range, in green color coordinates of light emitted from the display apparatus 1, the x-coordinate may have the range of 0.220 to 0.240, and the y-coordinate may have the range of 0.720 to 0.740.

For example, the second color filter 420 may be a red color filter through which red light of light emitted from the light-emitting layer 220 selectively transmits. For example, light having a wavelength belonging to about 600 nm to about 710 nm may transmit through the second color filter 420.

For example, the third color filter 430 may be a blue color filter through which blue light of light emitted from the light-emitting layer 220 selectively transmits. For example, light having a wavelength belonging to about 430 nm to about 490 nm may transmit through the third color filter 430.

In an embodiment, the display apparatus 1 may overlap the first through third color filters 410, 420, and 430 to define a light-shielding portion BM. In another embodiment, the display apparatus 1 may further include an additional light-shielding layer including a light-shielding material instead of forming the light-shielding portion BM by overlapping the first through third color filters 410, 420, and 430.

In an embodiment, the display apparatus 1 may further include an overcoat layer 500 on the color filter layer 400. The overcoat layer 500 may include a colorless transparent material.

Figure 4:
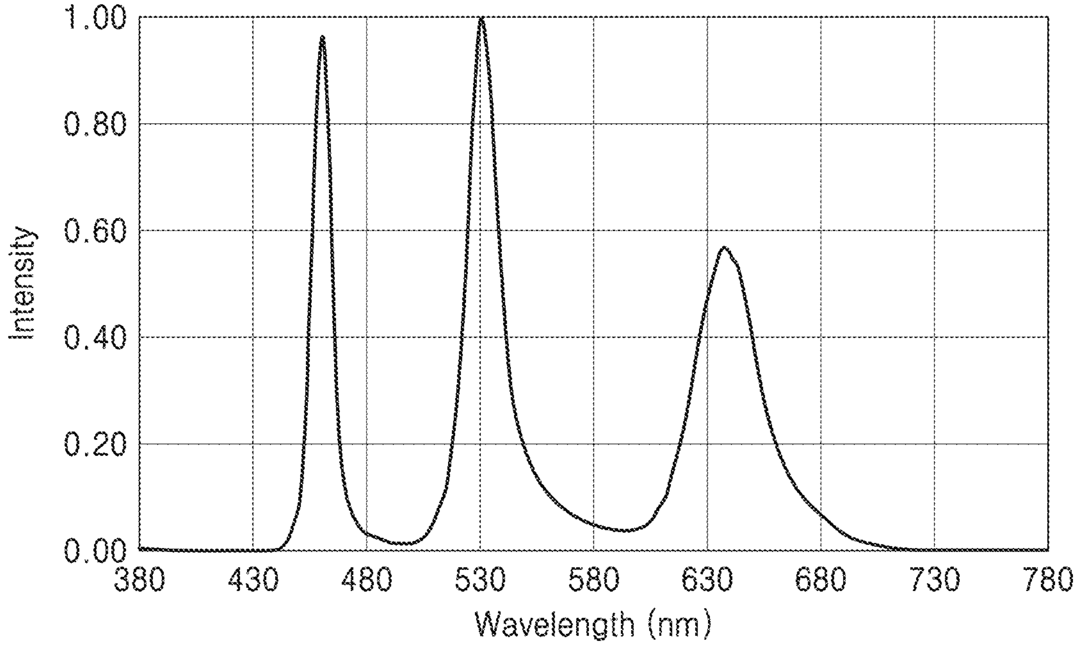
FIG. 4 is a graph showing emission spectrum of a light-emitting layer of an organic light-emitting diode (OLED) according to an embodiment.

FIG. 4 is a graph showing emission spectrum of the light-emitting layer 220 of the organic light-emitting diode (OLED) in the display apparatus 1 according to an embodiment.

Referring to FIG. 4, the light-emitting layer 220 may emit light having a peak intensity in the first wavelength range of about 435 nm to about 490 nm, the second wavelength range of about 500 nm to about 590 nm, and the third wavelength range of about 600 nm to about 710 nm. That is, each of the first through third organic light-emitting diodes OLED1, OLED2, and OLED3 described above with reference to FIG. 3 may emit light having a peak intensity in the first wavelength range of about 435 nm to about 490 nm, the second wavelength range of about 500 nm to about 590 nm, and the third wavelength range of about 600 nm to about 710 nm. Each of the first through third organic light-emitting diodes OLED1, OLED2, and OLED3 may emit same white light.

Figure 5:
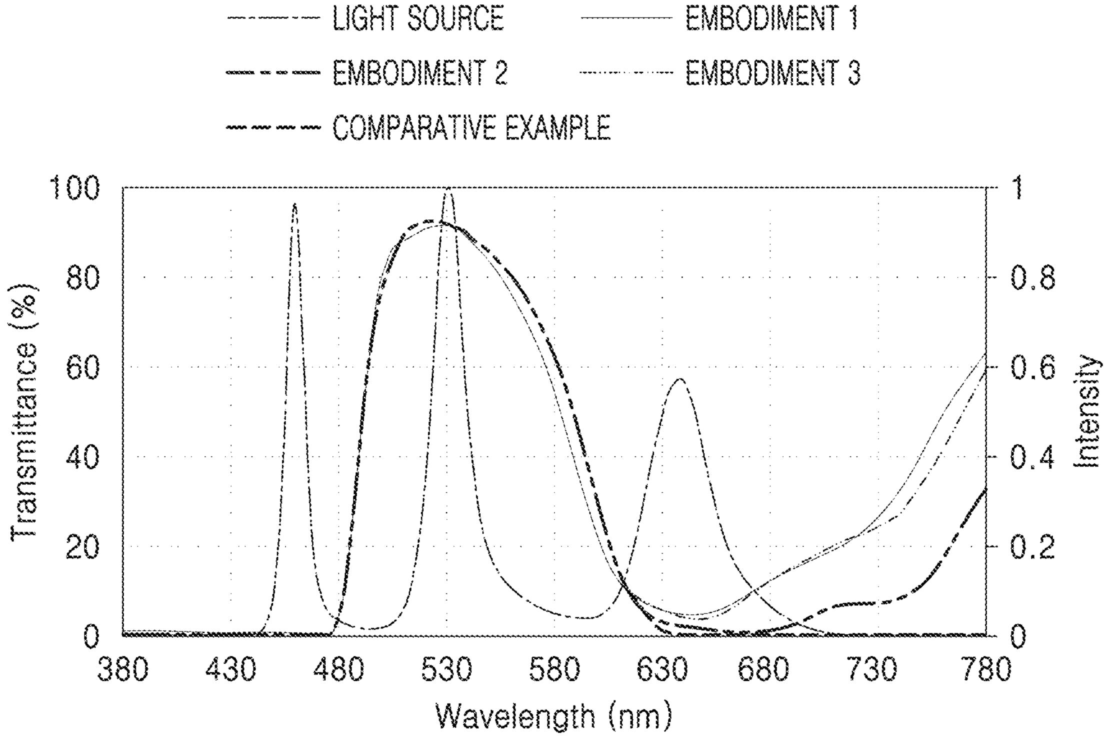
FIG. 5 is a graph schematically showing a transmission spectrum of a first color filter according to embodiments.
Figure 6:
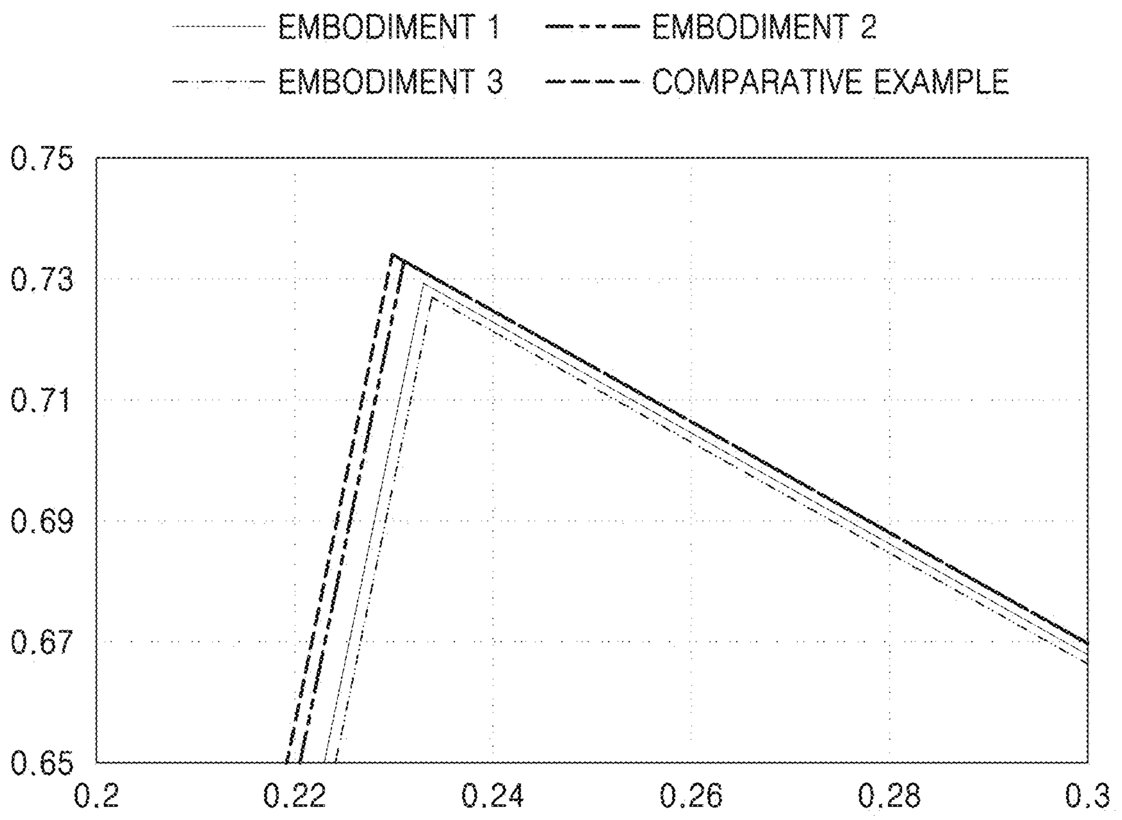
FIG. 6 is a graph showing color coordinates of a display apparatus including a first color filter according to embodiments, described above with reference to FIG. 5.

FIG. 5 is a graph schematically showing a transmission spectrum of the first color filter 410 according to embodiments and a comparative example. FIG. 5 illustrates the emission spectrum of the light-emitting layer 220 of the organic light-emitting diode OLED described above with reference to FIG. 4. FIG. 6 is a graph showing color coordinates of a display apparatus including a first color filter according to embodiments and a comparative example, described above with reference to FIG. 5.

In FIG. 5, the spectrum of light emitted from the light-emitting layer 220 of the organic light-emitting diode OLED corresponds to the right y-coordinate (intensity of light). Also, the transmission spectrum of the first color filter 410 according to embodiments corresponds to the left y-coordinate (transmittance).

Referring to FIG. 5, each of the first color filters 410 according to Embodiments 1 through 3 may have a transmittance of 80% or more in the wavelength range of 510 nm to 550 nm. Also, each of the first color filters 410 according to Embodiments 1 through 3 may have a transmittance of 0% to 20% or more in the wavelength range of 630 nm to 660 nm. On the other hand, the first color filter 410 according to the comparative example may have a transmittance of 80% or more in the wavelength range of 510 nm to 550 nm, and light in the wavelength range of 630 nm to 660 nm does not transmit through the first color filter 410 according to the comparative example.

The first color filter 410 according to Embodiment 1 may have a transmittance of about 83% to about 91% in the wavelength range of 510 nm to 550 nm and a transmittance of about 4.8% to about 6.6% in the wavelength range of 630 nm to 660 nm. The first color filter 410 according to Embodiment 2 may have a transmittance of about 85% to about 92% in the wavelength range of 510 nm to 550 nm and a transmittance of about 1.0% to about 3.5% in the wavelength range of 630 nm to 660 nm. The first color filter 410 according to Embodiment 3 may have a transmittance of about 85% to about 92% in the wavelength range of 510 nm to 550 nm and a transmittance of about 4.6% to about 6.5% in the wavelength range of 630 nm to 660 nm. The first color filter 410 according to the comparative example may have a transmittance of about 85% to about 92% in the wavelength range of 510 nm to 550 nm and may have a transmittance of 0% in the wavelength range of 630 nm to 660 nm.

Specifically, the first color filter 410 according to Embodiment 1 may have a transmittance of 91.0% in 530 nm that is the first peak wavelength of the light-emitting layer 220 and a transmittance of 4.94% that is the second peak wavelength of the light-emitting layer 220. The first color filter 410 according to Embodiment 2 may have a transmittance of 91.7% in the wavelength range of 530 nm and 510 nm to 550 nm that is the first peak wavelength of the light-emitting layer 220 and a transmittance of 2.08% in 640 nm that is the second peak wavelength of the light-emitting layer 220. The first color filter 410 according to Embodiment 3 may have a transmittance of 91.7% in 530 nm that is the first peak wavelength of the light-emitting layer 220 and a transmittance of 4.98% in 640 nm that is the second peak wavelength of the light-emitting layer 220. The first color filter 410 according to the comparative example may have a transmittance of 91.7% in 530 nm that is the first peak wavelength of the light-emitting layer 220 and a transmittance of 0% in 640 nm that is the second peak wavelength of the light-emitting layer 220.

The ratio of a transmittance of the first color filter 410 in the wavelength range of 510 nm to 550 nm to a transmittance of the first color filter 410 in the wavelength range of 630 nm to 660 nm according to Embodiment 1 may be about 1:0.053 to about 1:0.080. The ratio of a transmittance of the first color filter 410 in the wavelength range of 510 nm to 550 nm to a transmittance of the first color filter 410 in the wavelength range of 630 nm to 660 nm according to Embodiment 2 may be about 1:0.011 to about 1:0.041. The ratio of a transmittance of the first color filter 410 in the wavelength range of 510 nm to 550 nm to a transmittance of the first color filter 410 in the wavelength range of 630 nm to 660 nm according to Embodiment 3 may be about 1:0.050 to about 1:0.076.

The ratio of a transmittance of the light-emitting layer 220 of the first color filter 410 in 530 nm that is the first peak wavelength to a transmittance of the light-emitting layer 220 of the first color filter 410 in 640 nm that is the second peak wavelength according to Embodiment 1 may be about 1:0.054. The ratio of a transmittance of the light-emitting layer 220 of the first color filter 410 in 530 nm that is the first peak wavelength to a transmittance of the light-emitting layer 220 of the first color filter 410 in 640 nm that is the second peak wavelength according to Embodiment 2 may be about 1:0.023. The ratio of a transmittance of the light-emitting layer 220 of the first color filter 410 in 530 nm that is the first peak wavelength to a transmittance of the light-emitting layer 220 of the first color filter 410 in 640 nm that is the second peak wavelength according to Embodiment 3 may be about 1:0.054.

FIG. 6 is a graph showing color coordinates of a display apparatus including a first color filter according to embodiments, described above with reference to FIG. 5. In FIG. 6, color coordinates of the display apparatus 1 including the light-emitting layer 220 that emits white light having the peak intensity described above with reference to FIG. 4 and the first color filter 410 having the transmission spectrum described above with reference to FIG. 5 are shown. The color coordinates of FIG. 6 are based on Commission Internationale de l'Eclairage (CIE) color coordinates.

Referring to FIG. 6, a color coordinate (x, y) according to Embodiment 1 is (0.233, 0.729). A color coordinate (x, y) according to Embodiment 2 is (0.231, 0.733). A color coordinate (x, y) according to Embodiment 3 is (0.234, 0.727). A color coordinate (x, y) according to the comparative example is (0.230, 0.735).

When the light-emitting layer 220 emits white light, as in the comparative example, when light transmits only in the green wavelength range of 510 nm to 550 nm, color coordinates are arranged on the left of the graph and have relatively greenish colors. In FIG. 6, when part of light transmits in the wavelength range of 630 nm to 660 nm, as in Embodiments 1 through 3, the color coordinates move to the right of the graph. Thus, according to the embodiments, light may have a first transmittance in the wavelength range of 510 nm to 550 nm and a second transmittance in the wavelength range of 630 nm to 660 nm, as in Embodiments first through 3.

When the first transmittance in the wavelength range of 510 nm to 550 nm is 80% or more and the ratio of the first transmittance in the wavelength range of 510 nm to 550 nm to the second transmittance in the wavelength range of 630 nm to 660 nm is about 1:0.01 to about 1:0.1, as shown in FIG. 6, in the color coordinates, the x-coordinate may be in a range of 0.220 to 0.240, and the y-coordinate may be in a range of 0.720 to 0.740.

A color coordinate (x, y) of DCI-P3 is (0.265, 0.690). When the first transmittance in the wavelength range of 510 nm to 550 nm is 90% or more and the ratio of the first transmittance in the wavelength range of 510 nm to 550 nm to the second transmittance in the wavelength range of 630 nm to 660 nm is about 1:0.3, the color coordinate (x, y) is (0.266, 0.701). When the first transmittance is 80% or more and the ratio of the first transmittance to the second transmittance is 1:0.01 to 1:0.3, in the color coordinates, the x-coordinate may be in range of 0.220 to 0.270, and the y-coordinate may be in a range of 0.680 to 0.740.

For example, the x-coordinate of the color coordinates according to embodiments may be in the range of 0.020 to 0.270, and the y-coordinate may be in the range of 0.680 to 0.740. For example, the x-coordinate of the color coordinates according to embodiments may be in the range of 0.220 to 0.266, and the y-coordinate may be in the range of 0.690 to 0.740. For example, the x-coordinate of the color coordinates according to embodiments may be in the range of 0.022 to 0.240, and the y-coordinate may be in the range of 0.720 to 0.740.

Thus, unlike that light emitted by the display apparatus including a color filter through which light transmits only in the green wavelength range has a relatively greenish color, when the first transmittance is 80% or more and the ratio of the first transmittance to the second transmittance has a range of 1:0.01 to 1:0.3, it may be designed that the color coordinates move relatively to the right and converge to a target color.

In a display apparatus according to an embodiment, an OLED that emits white light may be designed to have the transmission spectrum of a first color filter corresponding to a green sub-pixel with a first transmittance in the wavelength range of 510 nm to 550 nm and a second transmittance in the wavelength range of 630 nm to 660 nm so that excellent color reproduction can be realized. Of course, the scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a substrate;

a display element layer disposed on the substrate and comprising a first display element, a second display element, and a third display element, the first display element, the second display element, and the third display element each emit light having a same peak spectrum; and a color filter layer disposed on the display element layer and comprising a first color filter disposed on the first display element, a second color filter disposed on the second display element, and a third color filter disposed on the third display element, wherein the first color filter has a transmission spectrum with a first transmittance in a wavelength range of and including 510 nm to 550 nm and a second transmittance in a wavelength range of and including 630 nm to 660 nm, and a ratio of the first transmittance to the second transmittance is in a range of and including 1:0.01 to 1:0.3.

2. The display apparatus of claim 1, wherein a ratio of the first transmittance to the second transmittance is in a range of and including 1:0.01 to 1:0.1.

3. The display apparatus of claim 1, wherein the first transmittance is in a range of and including 80% to 99%.

4. The display apparatus of claim 1, wherein the second transmittance is in a range of and including 1% to 20%.

5. The display apparatus of claim 1, wherein a first sub-pixel includes the first display element and the first color filter, a second sub-pixel includes the second display element and the second color filter, and a third sub-pixel includes the third display element and the third color filter, and in color coordinates based on Commission Internationale de l'Eclairage (CIE) color coordinates, an x coordinate of light emitted by the first sub-pixel is in a range of and including 0.220 to 0.270, and a y coordinate of the light emitted by the first sub-pixel is in a range of and including 0.680 to 0.740.

6. The display apparatus of claim 1, wherein the first display element, the second display element, and the third display element each emit white light.

7. The display apparatus of claim 6, wherein each of the first display element, the second display element, and the third display element has a peak in a first wavelength range of and including 435 nm to 490 nm, a second wavelength range of and including 500 nm to 590 nm, and a third wavelength range of and including 600 nm to 710 nm.

8. The display apparatus of claim 1, wherein the substrate comprises a semiconductor material.

9. The display apparatus of claim 1, further comprising a pixel circuit layer comprising at least one transistor between the substrate and the display element layer, wherein the transistor comprises a metal-oxide semiconductor field effect transistor (MOSFET).

10. A display apparatus comprising:

a substrate;

a display element layer disposed on the substrate and comprising a first display element, a second display element, and a third display element, the first display element, the second display element, and the third display element each emit white light; and a color filter layer disposed on the display element layer and comprising a first color filter disposed on the first display element, a second color filter disposed on the second display element, and a third color filter disposed on the third display element, wherein the first color filter has a transmission spectrum with a first transmittance in a wavelength range of and including 510 nm to 550 nm and a second transmittance in a wavelength range of and including 630 nm to 660 nm, and the first transmittance is in a range of and including 80% to 99%.

11. The display apparatus of claim 10, wherein a ratio of the first transmittance to the second transmittance is in a range of 1:0.01 to 1:0.3.

12. The display apparatus of claim 10, wherein the second transmittance is in a range of and including 1% to 20%.

13. The display apparatus of claim 10, wherein a first sub-pixel includes the first display element and the first color filter, a second sub-pixel includes the second display element and the second color filter, and a third sub-pixel includes the third display element and the third color filter, and in color coordinates based on Commission Internationale de l'Eclairage (CIE) color coordinates, an x coordinate of light emitted by the first sub-pixel is in a range of and including 0.220 to 0.270, and a y coordinate of the light emitted by the first sub-pixel is in a range of and including 0.680 to 0.740.

14. The display apparatus of claim 10, wherein a peak spectrum of each of the first display element, the second display element, and the third display element has a peak in a first wavelength range of and including 435 nm to 490 nm, a second wavelength range of and including 500 nm to 590 nm, and a third wavelength range of and including 600 nm to 710 nm.

15. The display apparatus of claim 10, wherein the substrate comprises a semiconductor material.

16. The display apparatus of claim 10, further comprising a pixel circuit layer comprising at least one transistor between the substrate and the display element layer, wherein the transistor comprises a metal-oxide semiconductor field effect transistor (MOSFET).

17. A display apparatus comprising:

a semiconductor substrate;

a display element layer disposed on the semiconductor substrate and comprising a first display element, a second display element, and a third display element, the first display element, the second display element, and the third display element each emit light having a same peak spectrum; and a color filter layer disposed on the display element layer and comprising a first color filter disposed on the first display element, a second color filter disposed on the second display element, and a third color filter disposed on the third display element, wherein the first color filter has a transmission spectrum with a first transmittance in a wavelength range of and including 510 nm to 550 nm and a second transmittance in a wavelength range of and including 630 nm to 660 nm, and a ratio of the first transmittance to the second transmittance is in a range of and including 1:0.01 to 1:0.3, a first sub-pixel includes the first display element and the first color filter, a second sub-pixel includes the second display element and the second color filter, and a third sub-pixel includes the third display element and the third color filter, and in color coordinates based on Commission Internationale de l'Eclairage (CIE) color coordinates, an x coordinate of light emitted by the first sub-pixel is in a range of and including 0.220 to 0.270, and a y coordinate of the light emitted by the first sub-pixel is in a range of and including 0.680 to 0.740.

18. The display apparatus of claim 17, wherein the first display element, the second display element, and the third display element emit white light.

19. The display apparatus of claim 18, wherein each of the first display element, the second display element, and the third display element has a peak in a first wavelength range of and including 435 nm to 490 nm, a second wavelength range of and including 500 nm to 590 nm, and a third wavelength range of and including 600 nm to 710 nm.

20. The display apparatus of claim 18, wherein a ratio of the first transmittance to the second transmittance is in a range of and including 1:0.01 to 1:0.1.

* * * * *